United States Patent
Yamada et al.

(10) Patent No.: US 9,320,184 B2
(45) Date of Patent: Apr. 19, 2016

(54) ESD PROTECTION STRUCTURE AND METHOD FOR MANUFACTURING THE SAME

(71) Applicant: Murata Manufacturing Co., Ltd., Nagaokakyo-shi, Kyoto-fu (JP)

(72) Inventors: Kosuke Yamada, Nagaokakyo (JP); Takashi Noma, Nagaokakyo (JP); Jun Adachi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/553,031

(22) Filed: Nov. 25, 2014

(65) Prior Publication Data

US 2015/0079273 A1 Mar. 19, 2015

Related U.S. Application Data

(63) Continuation of application No. 13/774,077, filed on Feb. 22, 2013, now abandoned, which is a continuation of application No. PCT/JP2011/070428, filed on Sep. 8, 2011.

(30) Foreign Application Priority Data

Sep. 10, 2010 (JP) .................. 2010-202722

(51) Int. Cl.
*H05K 9/00* (2006.01)
*H02H 9/04* (2006.01)
*H01T 4/12* (2006.01)
*H01T 21/00* (2006.01)

(52) U.S. Cl.
CPC .............. *H05K 9/0079* (2013.01); *H01T 4/12* (2013.01); *H01T 21/00* (2013.01); *H02H 9/04* (2013.01)

(58) Field of Classification Search
CPC ........... H02H 9/04; H02H 1/00; H05K 13/00; H05K 9/0079; H01L 29/66; H01T 4/12; H01T 21/00
See application file for complete search history.

(56) References Cited

U.S. PATENT DOCUMENTS 8,426,889 B2 * 4/2013 Adachi .................... H01T 4/12
257/173

OTHER PUBLICATIONS

Yamada et al., "ESD Protection Structure and Method for Manufacturing the Same", U.S. Appl. No. 13/744,077, filed Feb. 22, 2013.

* cited by examiner

*Primary Examiner* — Zeev V Kitov
(74) *Attorney, Agent, or Firm* — Keating & Bennett, LLP

(57) ABSTRACT

An ESD protection device includes an alumina multilayer substrate, a hollow portion, a discharge electrode pair, discharge-assisting electrodes, and a vitreous substance. The hollow portion is disposed inside of the alumina multilayer substrate. The electrodes of the discharge electrode pair are disposed opposite to each other at an interface between the hollow portion and the alumina multilayer substrate. The discharge-assisting electrodes are disposed dispersedly between the opposite electrodes of the discharge electrode pair. The vitreous substance covers the discharge-assisting electrodes in the inside of the hollow portion. A trial discharge is executed so as to induce creepage discharge between the electrodes of the discharge electrode pair in advance.

6 Claims, 6 Drawing Sheets

ESD PROTECTION STRUCTURE AND METHOD FOR MANUFACTURING THE SAME

BACKGROUND OF THE INVENTION

1. Field of the Invention

The present invention relates to an ESD protection structure to protect a circuit element and the like from static electricity and a method for manufacturing the same.

2. Description of the Related Art

In general, various types of electronic equipment may be vulnerable to electrostatic discharge, e.g., a surge. In that case, an ESD (Electro-Static-Discharge) protection structure may be adopted to protect a circuit element from electrostatic discharge. An ESD protection structure is a structure that leads an excessive voltage from a signal line to a ground line by utilizing a discharge phenomenon in order to protect the circuit element from electrostatic electricity.

At present, a device, in which a hollow portion is disposed in a glass ceramic substrate, a pair of discharge electrodes connected to the signal line and the ground line, respectively, are disposed opposite to each other in the hollow portion, and particulate discharge-assisting electrodes are disposed dispersedly between the pair of discharge electrodes, has been developed as a device having the ESD protection structure (refer to, for example, International Publication No. 2010/061550). In this device structure, in the case where an excessive voltage is applied to the signal line, discharge occurs between the pair of discharge electrodes through discharge-assisting electrodes, so that static electricity is led to the ground.

Here, the mechanism that causes an occurrence of a discharge phenomenon in this device configuration will be described with reference to FIGS. 1A and 1B. FIGS. 1A and 1B are diagrams showing a configuration example of an ESD protection device including an ESD protection structure.

An ESD protection device 100A shown in FIG. 1A includes an insulating substrate 102, a portion of the region of which is exposed at the inside of a hollow portion 101, discharge electrodes 103A and 103B disposed while being stacked on the insulating substrate 102 in such a way that end portions exposed at the inside of the hollow portion 101 are opposed to each other, and a plurality of discharge-assisting electrodes 104 disposed dispersedly between the discharge electrodes 103A and 103B. The discharge-assisting electrodes 104 are made from insulating material-coated metal particles. Meanwhile, an ESD protection device 100B shown in FIG. 1B is an example in which a hollow portion 101 is formed not into a square shape, but into a hemispherical shape.

When a high voltage is applied between the discharge electrodes 103A and 103B, electrons are released from one electrode 103A. The electrons induce a secondary electron avalanche phenomenon due to collision with atoms in a high electric field and, thereby, many electrons are released from the atoms, so that discharge occurs between the discharge electrodes 103A and 103B. This discharge occurs as creepage discharge on a creepage surface between the hollow portion 101 and the insulating substrate 102. The discharge-assisting electrodes 104 made from insulating material-coated metal particles are disposed dispersedly between the discharge electrodes 103A and 103B, and a larger number of creepage surfaces are formed, so that the ESD discharge responsivity becomes stable.

Variations in interval of disposition of the discharge-assisting electrodes cannot be suppressed, and the ESD discharge responsivity cannot be stabilized completely, so that variations occur between products. Specifically, discharge occurs at a low voltage easily in a place where the particle interval between adjacent discharge-assisting electrodes is small and a place where particles are in contact with each other. This causes a reduction in breakdown voltage in the ESD discharge responsivity.

In addition, variations in the ESD discharge responsivity also occur because of coverage of circumferences of the discharge-assisting electrodes with a vitreous substance in production. Specifically, various constituent materials around the hollow portion are altered to become an insulating vitreous substance because of an oxidation reaction in the production (in firing or the like). Discharge through the discharge-assisting electrodes is prevented by coverage with this vitreous substance. This causes an increase in breakdown voltage in the ESD discharge responsivity, in contrast to the above-described variations in interval of disposition.

Furthermore, because of the above-described factors, not only variations between products, but also fluctuations due to repeated discharge occur in the ESD discharge responsivity. Specifically, reactions, e.g., vaporization, due to discharge occur at a location at which discharge phenomena concentrate, a change in a fine structure is induced, and this causes fluctuations in the ESD discharge responsivity due to repeated discharge.

SUMMARY OF THE INVENTION

Accordingly, preferred embodiments of the present invention provide an ESD protection structure having a configuration capable of significantly and reducing variations in ESD discharge responsivity between products and fluctuations in the ESD discharge responsivity due to repeated discharge and a method for manufacturing an ESD protection structure.

A method for manufacturing an ESD protection structure according to a preferred embodiment of the present invention is a method for manufacturing an ESD protection structure provided with an insulating portion, a pair of discharge electrodes disposed at a distance from each other on the surface of the insulating portion, and discharge-assisting electrodes dispersed between the pair of discharge electrodes, and the method including the step of executing a firing step of forming electrode layers defining and serving as the pair of discharge electrodes and insulating material-coated metal particles and/or semiconductor particles defining and serving as the discharge-assisting electrodes on the insulating portion and forming the ESD protection structure by firing, and a trial discharge step of applying a voltage exceeding a discharge voltage between the pair of discharge electrodes after the firing step is executed.

According to this manufacturing method, in the firing step, a discharge path is formed from not only the insulating material-coated metal particles, but also the semiconductor particles. Consequently, the ESD discharge responsivity is stabilized as compared with that in the case where the discharge path is formed from only the insulating material-coated metal particles. In addition, in the firing step, a vitreous substance covering circumferences of the discharge-assisting electrodes is formed from various constituent materials around the discharge-assisting electrodes. Then, in the trial discharge step, the vitreous substance covering the discharge-assisting electrodes is removed partly, the discharge-assisting electrodes are exposed and, as a result, the state in which formation of a discharge path is hindered by the vitreous substance is eliminated. Consequently, a substantial path length of creepage surface is reduced and a breakdown voltage is lowered. If the whole discharge-assisting electrodes are covered with the vitreous substance, variations in the breakdown voltage having a tendency to increase are exhibited. However, variations in the breakdown voltage having a tendency to increase can be significantly reduced and prevented by removing the vitreous substance so as to reduce the path length of the discharge path. Meanwhile, missing of particles of portions of the discharge-assisting electrodes and growth of a crack in the vitreous substance occur in the trial discharge step. Occurrences of these phenomena at places where particle intervals of the discharge-assisting electrodes are small and at places where particles are in contact with each other can extend the substantial path length of creepage discharge and increase the breakdown voltage. Consequently, it is possible to significantly reduce and prevent variations in the breakdown voltage having a tendency to decrease in the state in which particle intervals of the discharge-assisting electrodes are small and the state in which particles are in contact with each other. In this regard, adhered materials of semiconductor compounds may be generated from the constituent materials of the discharge-assisting electrodes in the trial discharge step. This forms a portion of a discharge path, so as to reduce the path length of the discharge path. From this point as well, variations in the breakdown voltage having a tendency to increase can be significantly reduced and prevented.

According to these facts, variations in the ESD discharge responsivity between products can be significantly reduced and prevented with respect to devices having an ESD protection structure. The discharge path is fixed gradually by inducing discharge repeatedly. Therefore, in the case where the trial discharge is induced at least once, fluctuations in the ESD discharge responsivity during discharge thereafter can be reduced.

In the method for manufacturing an ESD protection structure according to a preferred embodiment of the present invention, favorably, the ESD protection structure is further provided with a hollow portion disposed adjoining the surface of the insulating portion, and a step of forming a sacrificial layer serving as the hollow portion on the insulating portion is further included before the firing step. Consequently, the discharge characteristic can be more stabilized as compared with that in the case where a hollow portion is not provided.

In the method for manufacturing an ESD protection structure according to a preferred embodiment of the present invention, favorably, the trial discharge step is executed a plurality of times. Consequently, fluctuations in the breakdown voltage can be significantly reduced and prevented more reliably.

In the method for manufacturing an ESD protection structure according to a preferred embodiment of the present invention, favorably, the insulating material-coated metal particles are preferably alumina-coated Cu particles and the semiconductor particles are SiC particles provided with oxide films. Consequently, a discharge path includes alumina-coated Cu particles and SiC particles provided with oxide films between the pair of discharge electrodes and, in addition, semiconductor compounds are generated, so that the ESD discharge responsivity is stabilized and is leveled.

An ESD protection structure according to another preferred embodiment of the present invention includes an insulating portion, a pair of discharge electrodes disposed at a distance from each other on the surface of the insulating portion, discharge-assisting electrodes disposed between the pair of discharge electrodes and made from insulating material-coated metal particles and/or semiconductor particles, and a vitreous substance disposed around the discharge-assisting electrodes, wherein discharge craters made by missing portions of discharge-assisting electrodes are disposed in the vitreous substance.

When the trial discharge step is executed in a production process of the ESD protection structure, portions of the discharge-assisting electrodes embedded in the vitreous substance may be missing so as to form discharge craters. Consequently, the particle interval of the discharge-assisting electrodes can be ensured and it is possible to significantly reduce and prevent variations in the breakdown voltage having a tendency to decrease by extending the substantial path length of creepage discharge.

An ESD protection structure according to a preferred embodiment of the present invention includes an insulating portion, a pair of discharge electrodes disposed at a distance from each other on the surface of the insulating portion, discharge-assisting electrodes disposed between the pair of discharge electrodes and made from insulating material-coated metal particles and/or semiconductor particles, and a vitreous substance disposed around the discharge-assisting electrodes, wherein discharge craters made by an occurrence of cracking in the vitreous substance are disposed.

When the trial discharge step is executed in a production process of the ESD protection structure, discharge craters may be generated by an occurrence of cracking in the vitreous substance. Consequently, it is possible to significantly reduce and prevent variations in the breakdown voltage having a tendency to decrease by extending the substantial path length of creepage discharge on the surface of the vitreous substance.

An ESD protection structure according to a preferred embodiment of the present invention includes an insulating portion, a pair of discharge electrodes disposed at a distance from each other on the surface of the insulating portion, discharge-assisting electrodes disposed between the pair of discharge electrodes and made from insulating material-coated metal particles and/or semiconductor particles, and a vitreous substance disposed around the discharge-assisting electrodes, wherein discharge craters at which the discharge-assisting electrodes are exposed are disposed in the vitreous substance by removal of a portion of the vitreous substance.

When the trial discharge step is executed in a production process of the ESD protection structure, discharge craters at which the discharge-assisting electrodes are exposed may be disposed by removal of a portion of the vitreous substance. Consequently, it is possible to significantly reduce and prevent variations in the breakdown voltage having a tendency to increase by reducing the substantial path length of creepage discharge.

In the above-described ESD protection device, a hollow portion is preferably disposed to adjoin the surface of the insulating portion.

In the ESD protection structure according to a preferred embodiment of the present invention, the insulating material-coated metal particles preferably are alumina-coated Cu particles and the semiconductor particles preferably are SiC particles provided with oxide films.

According to various preferred embodiments of the present invention, a discharge path is defined by the discharge-assisting electrodes containing not only the insulating material-coated metal particles, but also the semiconductor particles. Consequently, the ESD discharge responsivity is stabilized as compared with that in the case where the discharge path is formed from only the insulating material-coated metal particles. In addition, missing of particles of the discharge-assisting electrodes partly or entirely embedded in the vitreous substance arranged to cover circumferences of the discharge-assisting electrodes, growth of cracks in the vitreous substance, partial removal of the vitreous substance, generation of adhered materials of semiconductors, and the like occur by application of a high voltage due to trial discharge. Consequently, the substantial particle interval of the discharge-assisting electrodes can be made uniform. According to this as well, the breakdown voltage is stabilized, so that variations in the ESD discharge responsivity between products can be reduced with respect to devices having an ESD protection structure, and fluctuations in the ESD discharge responsivity to repeated discharge can be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An ESD protection structure according to the first preferred embodiment of the present invention and a method for manufacturing the same will be described below with reference to FIGS. 2A to 5. In this regard, in the following explanations, various preferred embodiments of the present invention will be described on the basis of an ESD protection device which is a device preferably including only an ESD protection function in order to simplify the explanations. However, preferred embodiments of the present invention are also applied to configurations in which the ESD protection structure is disposed in other devices, for example, a multilayer device provided with IC and the like.

Figure 1A:
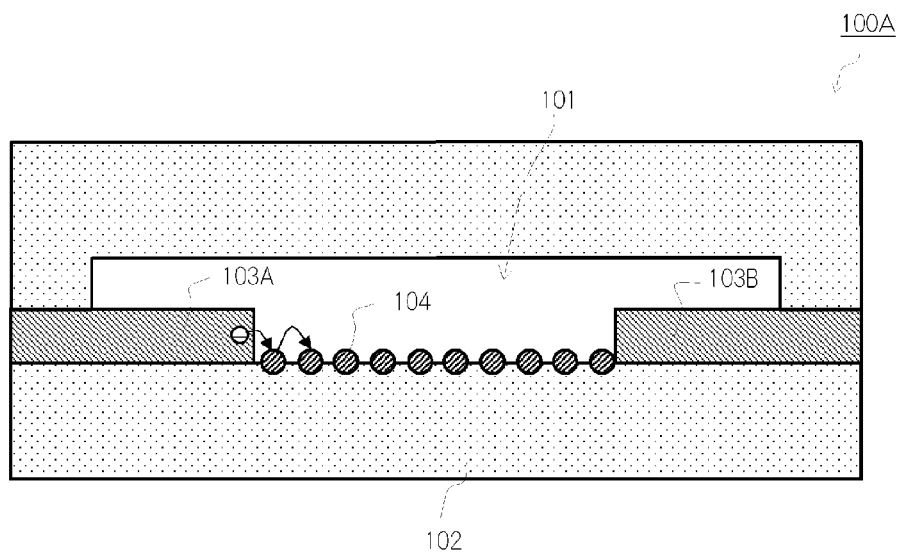
FIGS. 1A and 1B are diagrams showing configuration examples of ESD protection devices in the related art.
Figure 1B:
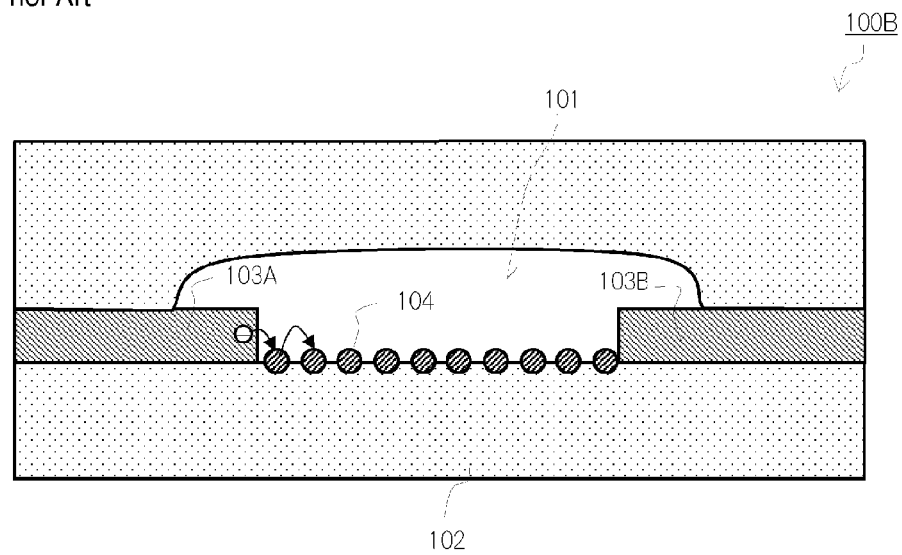
Figure 2A:
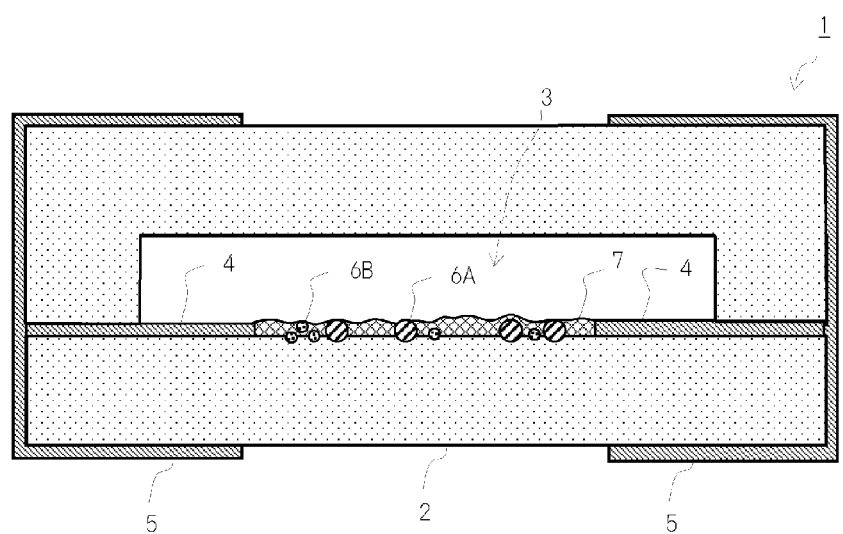
FIGS. 2A and 2B are sectional views illustrating a configuration example of an ESD protection device according to a first preferred embodiment of the present invention.
Figure 2B:
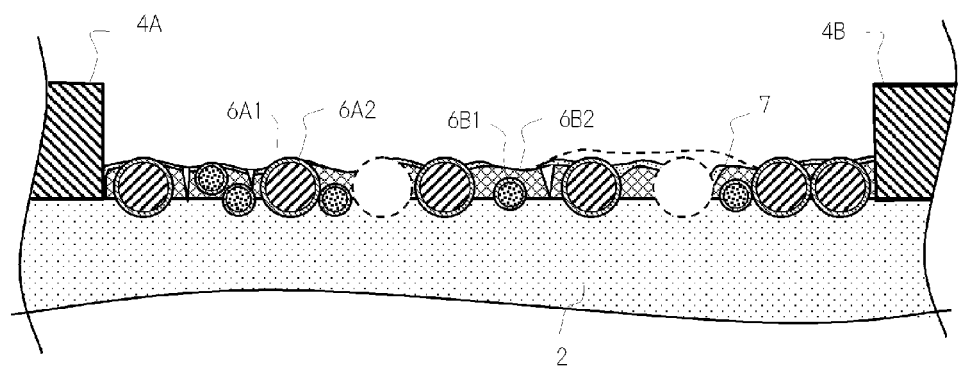

FIG. 2A is a diagram illustrating a configuration example of an ESD protection device according to the present preferred embodiment. FIG. 2B is a magnified diagram of a key portion (ESD protection structure) of the above-described device.

As shown in FIG. 2A, the ESD protection device 1 is provided with an alumina multilayer substrate 2, a hollow portion 3, a discharge electrode pair 4, an external electrode pair 5, discharge-assisting electrodes 6A and 6B, and a vitreous substance 7.

The alumina multilayer substrate 2 is an insulating portion and preferably is a laminate of alumina substrates. The hollow portion 3 is disposed in the inside of the alumina multilayer substrate 2. The discharge electrode pair 4 includes a discharge electrode 4A and a discharge electrode 4B and is disposed at an inside interface of the alumina multilayer substrate 2 in such a way that an end portion of the discharge electrode 4A and an end portion of the discharge electrode 4B are exposed individually at the inside of the hollow portion 3 while opposing each other with an interval therebetween. The external electrode pair 5 is disposed on the outer surface of the alumina multilayer substrate 2 while each of the external electrodes is connected to one electrode of the discharge electrode pair 4. The discharge-assisting electrodes 6A and 6B are disposed on the alumina multilayer substrate 2 in the vicinity of the hollow portion 3. The vitreous substance 7 is disposed in the inside of the hollow portion 3 so as to surround the discharge-assisting electrodes 6A and 6B.

In the ESD protection structure shown in FIG. 2B in detail, the discharge-assisting electrodes 6A have a particle diameter larger than the particle diameter of the discharge-assisting electrodes 6B, and are disposed dispersedly at the interface between the hollow portion 3 and the alumina multilayer substrate 2 and in the inside of the alumina multilayer substrate in the vicinity of the interface at nonuniform intervals. Alternatively, the discharge-assisting electrodes 6A and 6B may be configured to be filled in the inside of the hollow portion 3. In this regard, the particle diameters of the discharge-assisting electrodes 6A and 6B are not limited to the above-described example. They may have the same particle diameter, or the particle diameter of the discharge-assisting electrodes 6A may be smaller than the particle diameter of the discharge-assisting electrodes 6B.

The discharge-assisting electrode 6A includes a particulate metal material 6A1 and an insulating film 6A2 disposed on the surface of the metal material 6A1. Meanwhile, the discharge-assisting electrode 6B includes a particulate semiconductor material 6B1 and an insulating film 6B2 disposed on the surface of the semiconductor material 6B1. Here, the metal material 6A1 preferably is a Cu particle and the semiconductor material 6B1 preferably is a SiC particle, for example. The insulating film 6A2 preferably is an alumina film and the insulating film 6B2 preferably is a $SiO_2$ film produced by oxidizing the semiconductor material 6B1, for example.

In this ESD protection structure, the vitreous substance 7 is disposed in the inside of the hollow portion 3 so as to surround the discharge-assisting electrodes 6A and 6B. The vitreous substance 7 is not formed intentionally, but is formed unintentionally by a reaction, e.g., oxidization, of constituent materials derived from a member surrounding a sacrificial layer used for forming the hollow portion 3.

In this ESD protection device 1, the breakdown voltage depends on the disposition intervals of the discharge-assisting electrodes 6A and 6B, the thickness of the vitreous substance 7, and the like. The disposition intervals of the discharge-assisting electrodes 6A and 6B and the thickness of the vitreous substance 7 are nonuniform and, therefore, there are variations between products and fluctuations along with repeated discharge in the breakdown voltage essentially. Accordingly, in the present preferred embodiment of the present invention, a trial discharge step, as described later, is executed to produce the ESD protection device 1. Consequently, creepage discharge is induced in the ESD protection structure prior to product shipment, so as to change the fine structure of the ESD protection structure and facilitate stabilization and leveling of the breakdown voltage.

Figure 3:
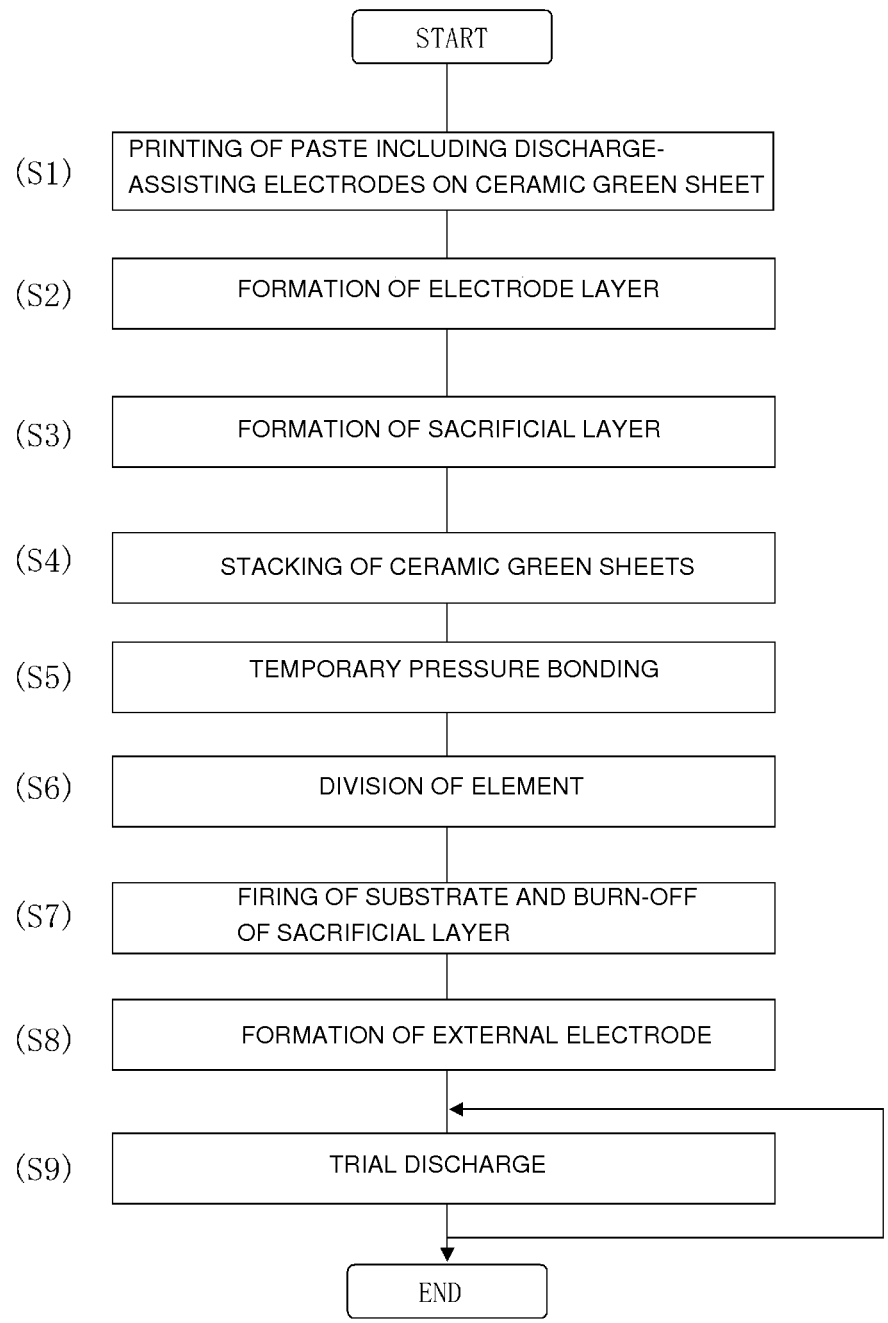
FIG. 3 is a chart showing a method for manufacturing an ESD protection device according to the first preferred embodiment of the present invention.

FIG. 3 is a flow chart illustrating an example of a method for manufacturing the ESD protection device 1 according to the present preferred embodiment.

A ceramic green sheet serving as a base member is prepared, and a paste containing the discharge-assisting electrodes 6A and 6B and a binder is printed on the upper surface thereof (S1). In this step, a pressure is applied between the paste and the ceramic green sheet, so as to embed the discharge-assisting electrodes 6A and 6B into the ceramic green sheet partly.

Electrode layers defining and serving as the discharge electrode pair 4 are formed on the upper surface of the ceramic green sheet provided with the discharge-assisting electrodes 6A and 6B by printing (S2). This step is executed by printing of an electrode paste.

A sacrificial layer is formed at a position where the hollow portion 3 is formed later on the above-described ceramic green sheet (S3). Preferably, this sacrificial layer is formed from an organic material or the like which is burnt off in the downstream step of firing the ceramic green sheet.

A ceramic green sheet to cover the electrode layers and the sacrificial layer is stacked on the upper surface of the ceramic green sheet provided with the electrode layers defining and serving as the discharge electrode pair 4 and the sacrificial layer (S4).

The laminate of the ceramic green sheets is pressurized, so that temporary pressure bonding is induced (S5).

The laminate of the ceramic green sheets is divided, so that element assemblies defining and serving as a plurality of ESD protection devices are formed (S6).

The laminate of the ceramic green sheets is heated, so that the firing step of forming a basic configuration of the above-described ESD protection device 1 by firing is executed (S7). In this case, the above-described sacrificial layer is burnt off and, as a result, the hollow portion 3 is formed. In addition, the insulating vitreous substance 7 is formed in the inside of the hollow portion 3 by a reaction, e.g., oxidization of various constituent materials surrounding the sacrificial layer.

The electrode paste defining and serving as the external electrode pair 5 is formed on the outside surface of the ESD protection device 1 (S8).

Thereafter, one electrode of the external electrode pair 5 of the ESD protection device 1 is connected to the ground and, in addition, the other electrode of the external electrode pair 5 is connected to a charge and discharge circuit including a switch and a capacitor, or an ESD gun, for example. The trial discharge step of applying an ESD pulse to the external electrode pair 5 is executed (S9). The voltage value of the ESD pulse is specified to be a voltage value sufficiently larger than the discharge voltage required for inducing creepage discharge. Consequently, creepage discharge is induced between the electrodes of the discharge electrode pair 4 through the discharge-assisting electrodes 6A and 6B. Favorably, this trial discharge step is executed at least two times.

As a result, in the ESD protection structure of this ESD protection device 1, creepage discharge occurs a plurality of times and, thus, a change occurs in the fine structure of the ESD protection structure, so that variations in the ESD discharge responsivity between products and fluctuations in the ESD discharge responsivity to repeated discharge are reduced.

Figure 7:
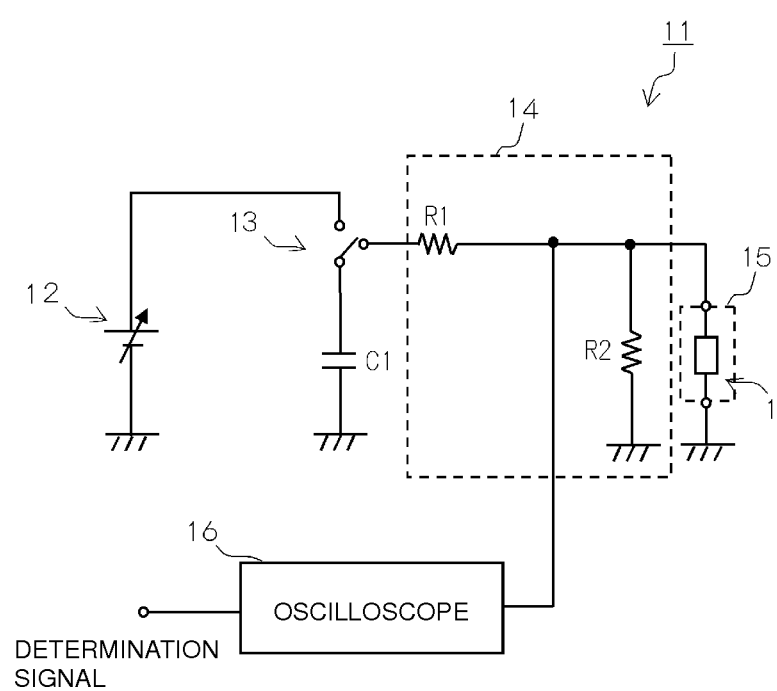
FIG. 7 is a diagram illustrating a configuration example of a charge and discharge circuit including a switch and a capacitor.

FIG. 7 is a diagram illustrating a configuration example of a charge and discharge circuit preferably including a switch and a capacitor. A charge and discharge circuit 11 (may be referred to as a discharge characteristic test apparatus) includes a charge voltage source 12, a capacitor C1, a charge and discharge switch 13, a resistance circuit 14, a device connection portion 15, and an oscilloscope 16. The charge and discharge switch 13 switches application of charge voltage to the capacitor C1 and an output of a discharge pulse from the capacitor C1, so as to induce discharge by applying an electric charge from the charged capacitor C1 to the resistance circuit 14 and the ESD protection device 1. The resistance circuit 14 determines a maximum pulse width of a discharge pulse together with the capacitor C1. When discharge occurs in the ESD protection device 1 connected to the device connection portion 15, the pulse width of the discharge pulse is reduced. Therefore, the voltage V across the terminals of the ESD protection device 1 is measured and the quality of the ESD protection device 1 is determined with the oscilloscope 16 by using the fact that a discharge waveform is different depending on presence or absence of discharge of the ESD protection device 1.

The discharge characteristic is selected on the basis of the discharge characteristic test apparatus 11 using the above-described capacitor C1, charge and discharge switch 13, and resistance circuit 14 and, as a result, an apparatus unit price can be reduced as compared with that of the ESD gun which has been previously used for selection of the discharge characteristic. In addition, the charge time per test can be reduced as compared with that of the ESD gun. Many ESD guns (discharge characteristic test apparatuses) have been required for performing production inspections by using the ESD gun with respect to many products (all products). However, a burden on the equipment cost can be reduced significantly by using the discharge characteristic test apparatus 11 having the above-described configuration instead of the ESD gun.

In this regard, the discharge characteristic test apparatus is not limited to the above-described configuration. It is enough that the discharge characteristic test apparatus has functions of measuring the voltage across the terminals of the capacitor when an electric charge from the charged capacitor is applied to the ESD protection device and discharge is induced and performing selection by using the fact that a waveform of the voltage across the terminals of the capacitor in the case where the discharge characteristic is normal is different from that in the case where the characteristic is bad. For example, the discharge characteristic test apparatus may be provided with a discharge determination portion which outputs a comparison signal with an output that is changed depending on the comparison between the pulse width and the threshold time of the discharge pulse, as a quality determination signal of the ESD protection device.

Figure 4A:
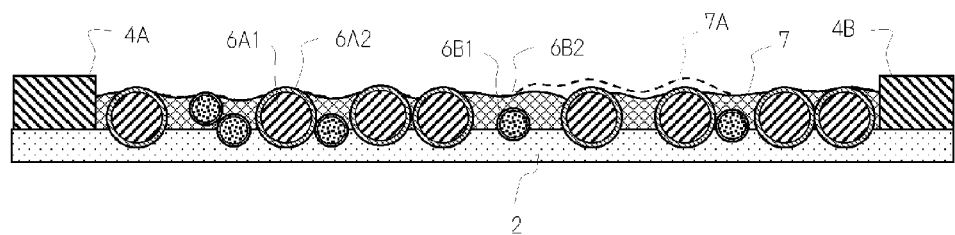
FIGS. 4A-4D show sectional views illustrating changes in a fine structure due to trial discharge of the ESD protection device shown in FIGS. 2A and 2B.

FIG. 4A is a diagram illustrating an example of changes in a fine structure of the ESD protection structure, where changes occur because of an occurrence of creepage discharge.

The ESD protection structure shown in FIG. 4A is an example in which the vitreous substance 7 is removed from a portion where collisions of the vitreous substance 7 and electrons occur intensively because of an occurrence of creepage discharge, so as to form a discharge crater 7A, and the discharge-assisting electrodes 6A having been covered with the vitreous substance 7 are exposed at the discharge crater 7A. Such a change in the fine structure can be examined after the trial discharge step is executed because traces, e.g., black discoloration, are present around the discharge crater 7A. When the discharge-assisting electrodes 6A are exposed at the discharge crater 7A, as described above, the state in which formation of a discharge path is hindered by the vitreous substance 7 can be eliminated at the place concerned, and variations in the breakdown voltage having a tendency to increase can be significantly reduced and prevented.

Figure 4B:
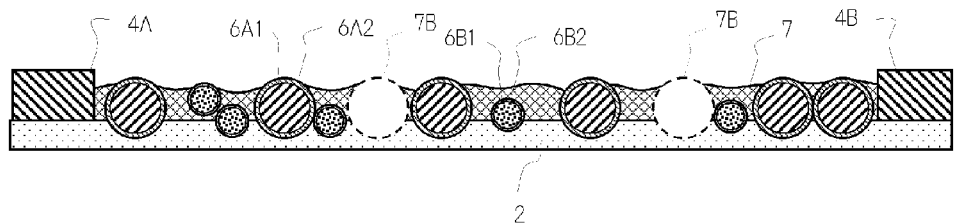

FIG. 4B is a diagram illustrating an example of changes in a fine structure of the ESD protection structure, where changes occur because of an occurrence of creepage discharge.

The ESD protection structure shown in FIG. 4B is an example in which a portion of the discharge-assisting electrodes 6A are removed from a portion where collisions of the discharge-assisting electrodes 6A and electrons occur intensively because of an occurrence of creepage discharge, so as to form discharge craters 7B where the discharge-assisting electrodes 6A are removed from the vitreous substance 7. Such a change in the fine structure occurs easily at the place where the discharge-assisting electrodes 6A are close to each other and collisions of electrons and atoms are concentrated and the place where the discharge-assisting electrodes 6A are in contact with each other and collisions of electrons and atoms are concentrated. This change in the fine structure can be examined after the trial discharge step is executed because neither discharge-assisting electrodes 6A nor a vitreous substance is present in the discharge crater 7B and traces, e.g., black discoloration, are present around the discharge crater 7B. When the discharge craters 7B are generated and the discharge-assisting electrodes 6A are removed, as described above, the state in which the discharge-assisting electrodes 6A are close to each other or the discharge-assisting electrodes 6A are in contact with each other can be eliminated, and variations in the breakdown voltage having a tendency to decrease can be significantly reduced and prevented. Meanwhile, the SiC powder in the discharge-assisting electrode (alumina-coated Cu powder, SiC powder) is decomposed partly and is vitrified. Therefore, the SiC powder is in the state of adhering to the vitreous substance firmly, so that alumina-coated Cu powder having a lower adhesion power is removed easily.

Figure 4C:
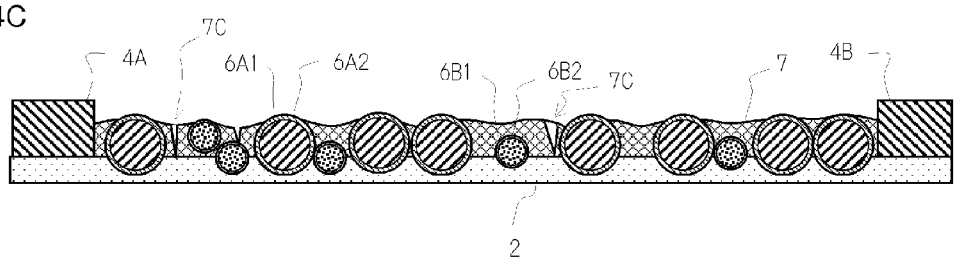
Figure 4D:
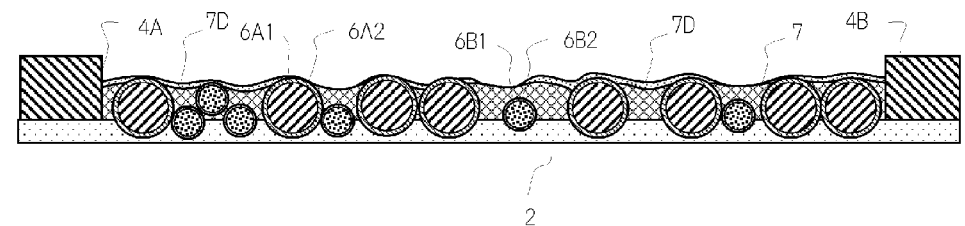

FIG. 4C is a diagram illustrating an example of changes in a fine structure of the ESD protection structure, where changes occur because of an occurrence of creepage discharge.

The ESD protection structure shown in the drawing is an example in which cracking occurs in a portion where collisions of the vitreous substance 7 and electrons occur intensively and a portion vulnerable to a thermal shock, so as to form discharge craters 7C. Such a change in the fine structure can be examined after the trial discharge step is executed because traces, e.g., black discoloration, are present around the discharge crater 7C and a crack is observed visually. When the discharge craters 7C are generated because of cracking, as described above, the substantial path length of creepage discharge is extended and, as a result, variations in the breakdown voltage having a tendency to decrease can be significantly reduced and prevented.

FIG. 4C is a diagram illustrating an example of changes in a fine structure of the ESD protection structure, where changes occur because of an occurrence of creepage discharge.

The ESD protection structure shown in FIG. 4C is an example in which the constituent materials for the discharge-assisting electrodes 6A and 6B are altered because of an occurrence of creepage discharge and, as a result, adhered materials 7D made from semiconductors are formed on the surface of the vitreous substance 7. In the first preferred embodiment, the metal material 6A1 of the discharge-assisting electrode 6A preferably is a Cu particle and, therefore, $Cu_2O$ is generated as the adhered material 7D of the semiconductor. The state in which formation of a discharge path is hindered by the vitreous substance 7 is eliminated and variations in the breakdown voltage having a tendency to increase can be significantly reduced and prevented by the above-described change in the fine structure as well.

The above-described individual changes of the fine structure may occur alone or may occur in combination. Only formation of the discharge crater 7A mainly due to removal of the vitreous substance 7 may occur by execution of the trial discharge step once and formation of the discharge crater 7B, the discharge crater 7C, and the adhered material 7D may occur by reactions of the discharge-assisting electrodes 6A and 6B, which have been exposed at the vitreous substance 7 by execution of the initial trial discharge step, by execution of the second and subsequent trial discharge steps. Therefore, variations in the ESD discharge responsivity between products and fluctuations in the ESD discharge responsivity to repeated discharge can be reduced more reliably by execution of a plurality of trial discharge steps.

Next, an example will be described, in which the relationship between the number of execution times of the trial discharge step and variations in the breakdown voltage of the ESD protection device 1 according to the present preferred embodiment was examined by an experiment.

Figure 5:
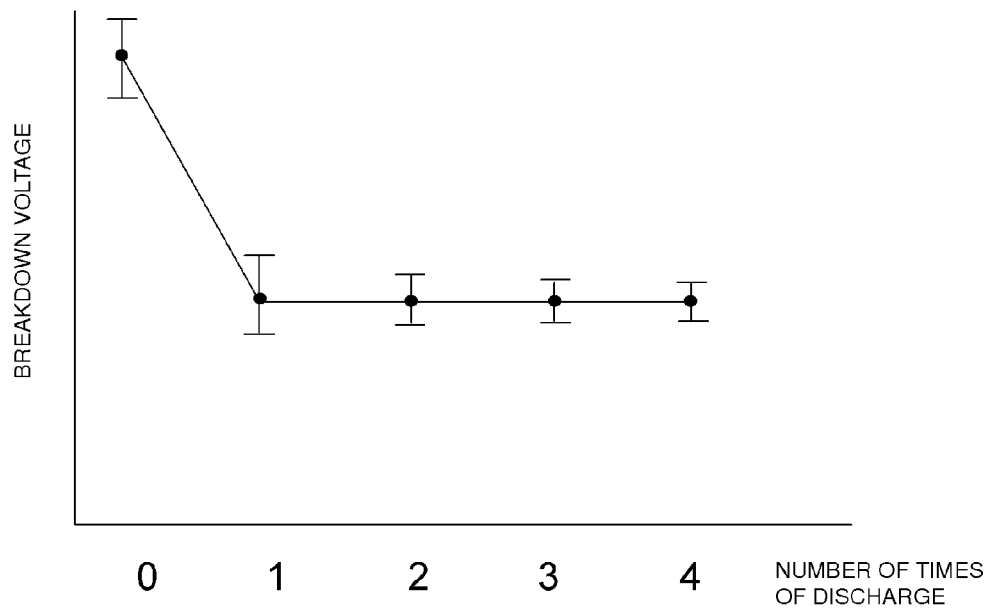
FIG. 5 is a diagram illustrating variations in the ESD discharge responsivity between products of the ESD protection device produced by the manufacturing method shown in FIG. 3.

FIG. 5 is a graph showing the relationship between the number of execution times of the trial discharge step and the voltage value and variations of the breakdown voltage. In the case where the number of execution times of the trial discharge step was zero, that is, in the case where a trial discharge step was not executed, the voltage value of the breakdown voltage was at a maximum, and the variation width thereof was large.

On the other hand, in the case where the trial discharge step was executed at least once, the voltage value of the breakdown voltage was reduced significantly. This is believed to occur because partial removal of the vitreous substance 7 was facilitated by execution of the trial discharge step once. Then, in the case where the trial discharge step was executed at least twice, a large change was not observed in the voltage value itself of the breakdown voltage, but variations in the breakdown voltage were reduced as the number of execution times of the trial discharge step increased.

As described above, and confirmed by the experiments as well, the advantageous effects of preferred embodiments of the present invention, that is, significant reduction and prevention of variations between products and fluctuations due to repeated discharge in the ESD discharge responsivity on the basis of partial removal of the vitreous substance 7, generation of cracks in the vitreous substance 7, removal of portions of discharge-assisting electrodes, and generation of adhered materials, by execution of the trial discharge step were able to be ascertained.

Figure 6:
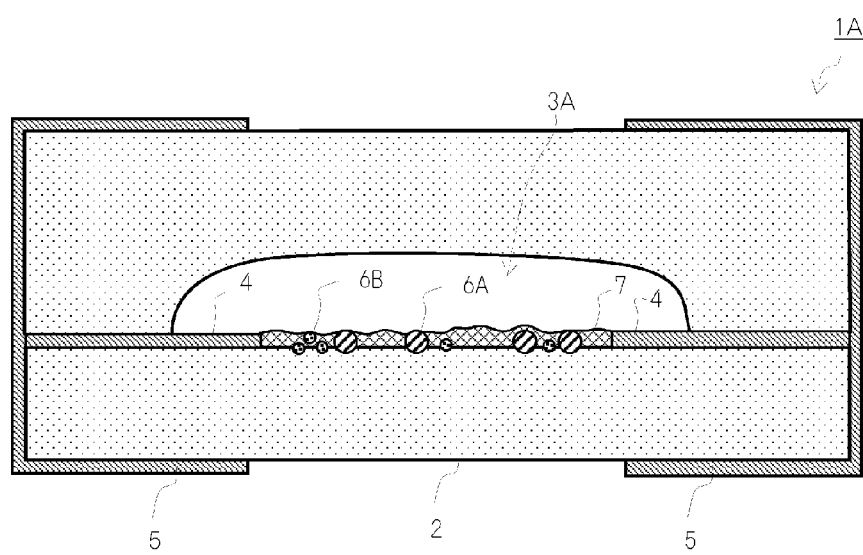
FIG. 6 is a sectional view illustrating a configuration example of an ESD protection device according to a second preferred embodiment of the present invention.

Next, a second preferred embodiment of the ESD protection device will be described. FIG. 6 is a sectional view showing a configuration example of an ESD protection device 1A according to the second preferred embodiment. This ESD protection device 1A includes a hollow portion 3A having a shape different from that in the above-described ESD protection device 1. The other configuration is preferably the same or substantially the same as that of the ESD protection device 1. The hollow portion 3A preferably has a hemispherical or substantially hemispherical shape. Such a hollow portion 3A is formed in such a way that, for example, the ceramic green sheet is deformed in the firing step and, as a result, the corner portion formed by the sacrificial layer and the ceramic green sheet is rounded. The ESD protection device may have such a configuration.

It should be understood that all explanations of the above-described individual preferred embodiments are no more than examples and are not limiting. The scope of the present invention is not determined by the above-described individual preferred embodiments, but by the appended claims. Furthermore, the present invention is intended to cover all modifications insofar as they are within the scope of the appended claims or the equivalents thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an ESD protection structure including an insulating portion, a pair of discharge electrodes disposed at a distance from each other on a surface of the insulating portion, and discharge-assisting electrodes dispersedly between the pair of discharge electrodes, the method comprising the steps of:

forming electrode layers defining the discharge electrode pair and insulating material-coated metal particles and/or semiconductor particles defining the discharge-assisting electrodes on the insulating portion;

firing the insulating portion including the electrode layers and the insulating material-coated metal particles and/or semiconductor particles to form the ESD protection structure;

forming a vitreous substance so as to surround the discharge-assisting electrodes during the firing step;

applying a voltage exceeding a discharge voltage between the pair of discharge electrodes after the firing step is executed; and forming a discharge crater in or on the vitreous substance by removing a portion of the vitreous substance.

2. The method for manufacturing an ESD protection structure according to claim 1, wherein the ESD protection structure includes a hollow portion disposed adjoining the surface of the insulating portion, and the method further includes a step of forming a sacrificial layer defining the hollow portion on the insulating portion before the firing step.

3. The method for manufacturing an ESD protection structure according to claim 1, wherein the step of applying a voltage is executed a plurality of times.

4. The method for manufacturing an ESD protection structure according to claim 1, wherein the insulating material-coated metal particles are alumina-coated Cu particles and the semiconductor particles are SiC particles provided with oxide films.

5. The method for manufacturing an ESD protection structure according to claim 1, wherein the insulating portion is an alumina multilayer substrate.

6. The method for manufacturing an ESD protection structure according to claim 1, wherein the particles of the discharge-assisting electrodes have different particle diameters.

* * * * *